US00RE34491E

United States Patent [19]

Driller et al.

[11] E Patent Number: Re. 34,491

[45] Reissued Date of Patent: Dec. 28, 1993

[54] CONTACT ARRAY ASSEMBLY FOR A COMPUTER-CONTROLLED PRINTED CIRCUIT BOARD TESTING APPARATUS

[75] Inventors: Hubert Driller; Paul Mang, both of Schmitten, Fed. Rep. of Germany

[73] Assignee: MANIA Elektronik Automatisation Entwicklung und Gerätebau GmbH, Schmitten, Fed. Rep. of Germany

[21] Appl. No.: 779,910

[22] Filed: Oct. 21, 1991

Related U.S. Patent Documents

Reissue of:

[64] Patent No.: 4,674,006
Issued: Jun. 16, 1987
Appl. No.: 903,835
Filed: Sep. 3, 1986

U.S. Applications:

[63] Continuation of Ser. No. 669,307, Nov. 7, 1984, abandoned.

[51] Int. Cl.[5] ..... H01B 1/02

[52] U.S. Cl. ..... 361/729; 324/158 F; 361/784

[58] Field of Search ..... 324/73 PC, 158 F; 439/65, 67, 74, 75, 54, 69; 361/352, 392–395, 398, 399, 412–415, 425, 426, 429, 417, 419, 420

[56] References Cited

U.S. PATENT DOCUMENTS

| | | | |
|---|---|---|---|
| 2,945,989 | 7/1960 | Vogel | 361/415 |
| 2,951,185 | 8/1960 | Buck | 361/415 |
| 3,702,423 | 11/1972 | Kern | 324/158 F |
| 3,829,741 | 8/1974 | Athey | 361/399 |
| 4,063,172 | 12/1977 | Faure | 324/158 F |
| 4,542,341 | 9/1985 | Santomango | 324/158 F |
| 4,674,006 | 6/1987 | Driller et al. | 361/393 |
| 4,724,377 | 2/1988 | Maelzer et al. . | |
| 4,887,353 | 12/1989 | Preputnick | 439/79 |

FOREIGN PATENT DOCUMENTS

| | | |
|---|---|---|
| 3110056 | 9/1982 | Fed. Rep. of Germany . |
| 3240916 | 5/1984 | Fed. Rep. of Germany . |

*Primary Examiner*—Gerald P. Tolin
*Attorney, Agent, or Firm*—Wenderoth, Lind & Ponack

[57] ABSTRACT

A contact array assembly for use with a computer-controlled printed circuit board testing apparatus includes an array of contacts into segments individually and releasably supported by supporting rods resting in a base plate. The space so created is utilized for accommodating the electronic circuitry components associated with these contact array segments and connected through plug-type connectors to a two-dimensional addressing and control logic on the base plate. These constructional units, referred to as modules or driver plates, are identical and may replace each other in any of the positions on the base plate. The invention results in a printed circuit board testing apparatus which may be designed for a very large number of contacts, but can be operated initially with a reduced amount of electronic circuitry and may be expanded later on, as desired.

20 Claims, 2 Drawing Sheets

FIG. 1
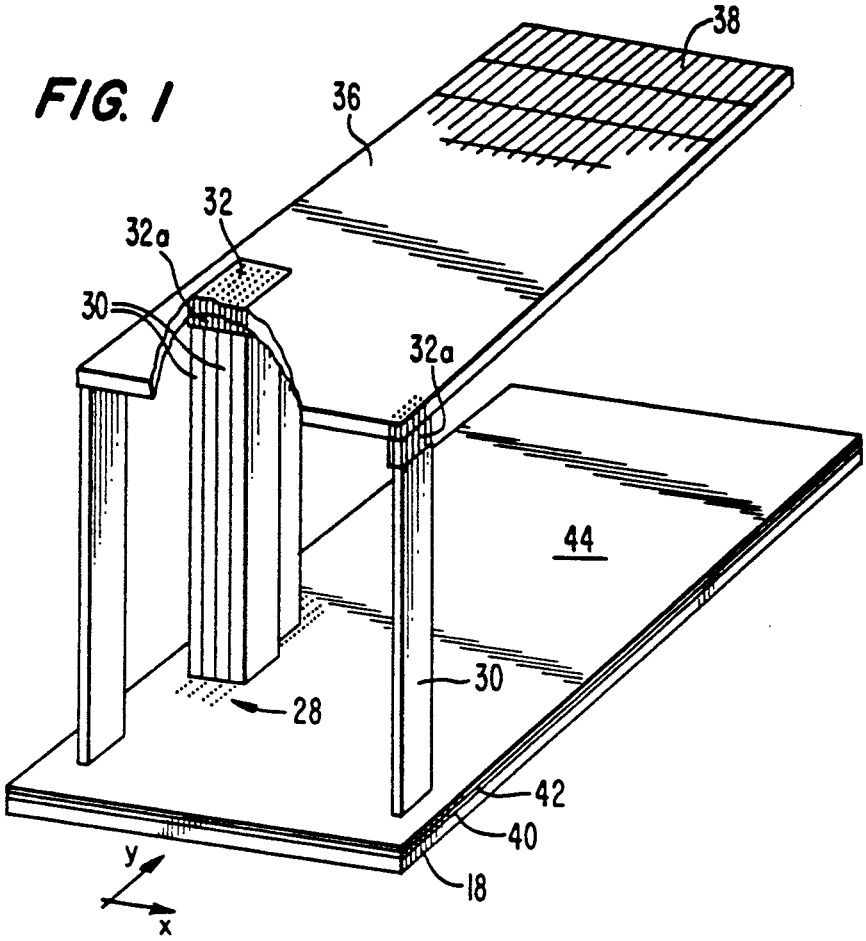
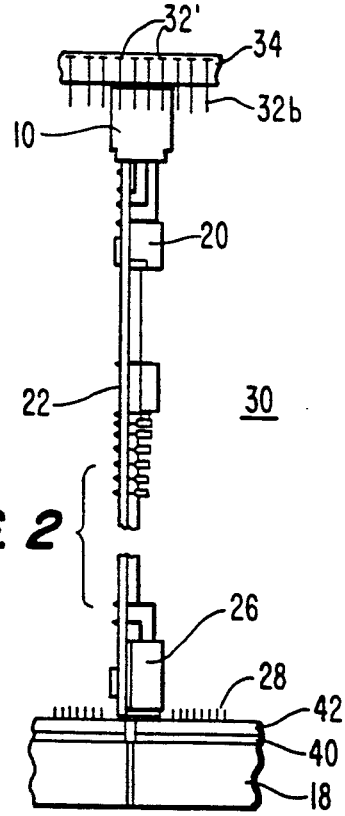
FIG. 2

CONTACT ARRAY ASSEMBLY FOR A COMPUTER-CONTROLLED PRINTED CIRCUIT BOARD TESTING APPARATUS

Matter enclosed in heavy brackets [ ] appears in the original patent but forms no part of this reissue specification; matter printed in italics indicates the additions made by reissue.

This application is a continuation of now abandoned application Ser. No. 669,307, filed Nov. 7, 1984 now abandoned.

BACKGROUND OF THE INVENTION

The practice of electronically testing industrially fabricated printed circuit boards has gained wide acceptance. Thus, the quality of the boards may be judged prior to further processing, such as the installation of [comparitively] *comparatively* expensive electronic components on the boards. If a printed circuit board has one thousand contacts, about 500,000 individual tests must be conducted on two-point connections to ensure that the board has been reliably tested, It has been found that the overall testing cannot be performed economically and in a justifiable time period unless it is done electronically by means of a computer.

The computer-controlled printed circuit board testing apparatus of this kind is programmed by placing a faultless master circuit board in a mount provided to receive the printed circuit boards. Then all possible combinations of two-point connections are automatically tested and the computer memorizes the results of each possible connection on the master circuit board. Thereafter, production circuit boards are fed into such apparatus for testing. In the testing process, each individual two-point connection is compared with the memorized information, and in the absence of identity between the measured information and the information memorized, an error output is generated and, if desired, the defective circuit board is automatically ejected.

The testing apparatus requires one contact for each possible connection point on each circuit board to be tested by the circuit board testing apparatus, with all these contacts arranged in a so-called contact array or reference grid. German Laid-Open Application No. 31 10 056, which is the starting point for the present invention, and the disclosure of which hereby is incorporated herein by reference, teaches a contact assembly for circuit board testing apparatus including a plurality of contacts provided in a contact plane. These contacts are arranged in groups of eight along the end surfaces of elongated flat contact plates shaped substantially like the letter "I".

These plates are held one behind the other in a dense pack by means of horizontal supports and form a strip of the contact plane which has a width of eight contacts. The horizontal supports receive the contact pressure, of which the total may assume considerable levels. The contact array or base grid in its entirety is made up of a plurality of such strips placed side by side, with the total array or grid possibly including many thousands of individual contacts. The purpose of dividing the contact array into a great number of plates or segments of this kind is to enable one or several of these segments to be removed as may be needed without having to disassemble the entire array.

At the other ends remote from the contact array, the I-shaped contact plates having the contacts at their one end are connected to wires for coupling to the computer-controlled test circuitry of the circuit board testing apparatus. Each contact has one wire connected thereto. As a result, a vast number of wires must be run along the bottom side of the contact array, presenting major difficulties to the repair or replacement of individual contact plates. Also, as these wires must be run up to the areas of the contact array in which they are connected, modification of the contact array (for adaptation to the contours of a circuit board to be tested, for example) are not provided for or even possible in practical applications. Also, the circuit board testing apparatus must be equipped from the start with a complete complement of the required testing electronics so that it will be able to test the maximum possible number of contacts on a circuit board although this extreme case may never occur.

It is an object of the present invention to provide a contact assembly for printed circuit board testing apparatus such that the user without difficulties may set up the contact array as to both the number of the required contacts and their distribution pattern across a given area within some given outer boundaries. In particular, the user is to be placed in a position merely having to add, in steps, the electronic circuitry needed for testing printed circuit boards having an increasing number of contacts.

Thus, the user's printed circuit board testing apparatus need only be equipped with precisely the amount of relatively expensive electronics which is actually needed to test the printed circuit boards of interest to the user. In other words, the invention seeks to make possible a printed circuit board testing apparatus which has a contact array expandable as needed in steps from a minimum of active contacts to a maximum possible number thereof and which, moreover, may be adapted to the shape of any specific circuit board to be tested within the limits determined by the outer dimensions of the apparatus. BRIEF DESCRIPTION OF THE INVENTION The space below the contours of the individual contact array segments is utilized for accommodating a major portion of the electronic components associated with these contacts and supporting rods for transmitting to a base plate the amount of contact pressure contributed by each contact array segment.

The units or contact array modules so formed are coupled through plug-type connectors provided at their bottom ends to the controlling logic circuitry in a manner such that any module may replace any other module, resulting in a contact assembly which is most flexible in application and allows for the ready addition of additional like modules. A basic complement of such modules (also referred to as "driver plates" hereinafter) is distributed over a base plate of maximum possible size in the manner required by the printed circuit board to be tested. The free positions on the base plate of the contact assembly receive dummy modules which carry no expensive electronic circuitry and serve solely to receive and to transmit to the base plate a portion of the contact pressure developed during testing.

BRIEF DESCRIPTION OF THE DRAWINGS

The principles of the invention will now be described with reference to an embodiment of the invention as illustrated schematically int he attached drawings, wherein FIG. 1 is a total perspective view of an assembly of the invention including a complete base plate and a number of contact modules, FIG. 2 is an elevation, partly in section, of a contact module and the base plate as well as portions of additional contact structure.

DETAILED DESCRIPTION OF A PREFERRED EMBODIMENT

Figure 3:
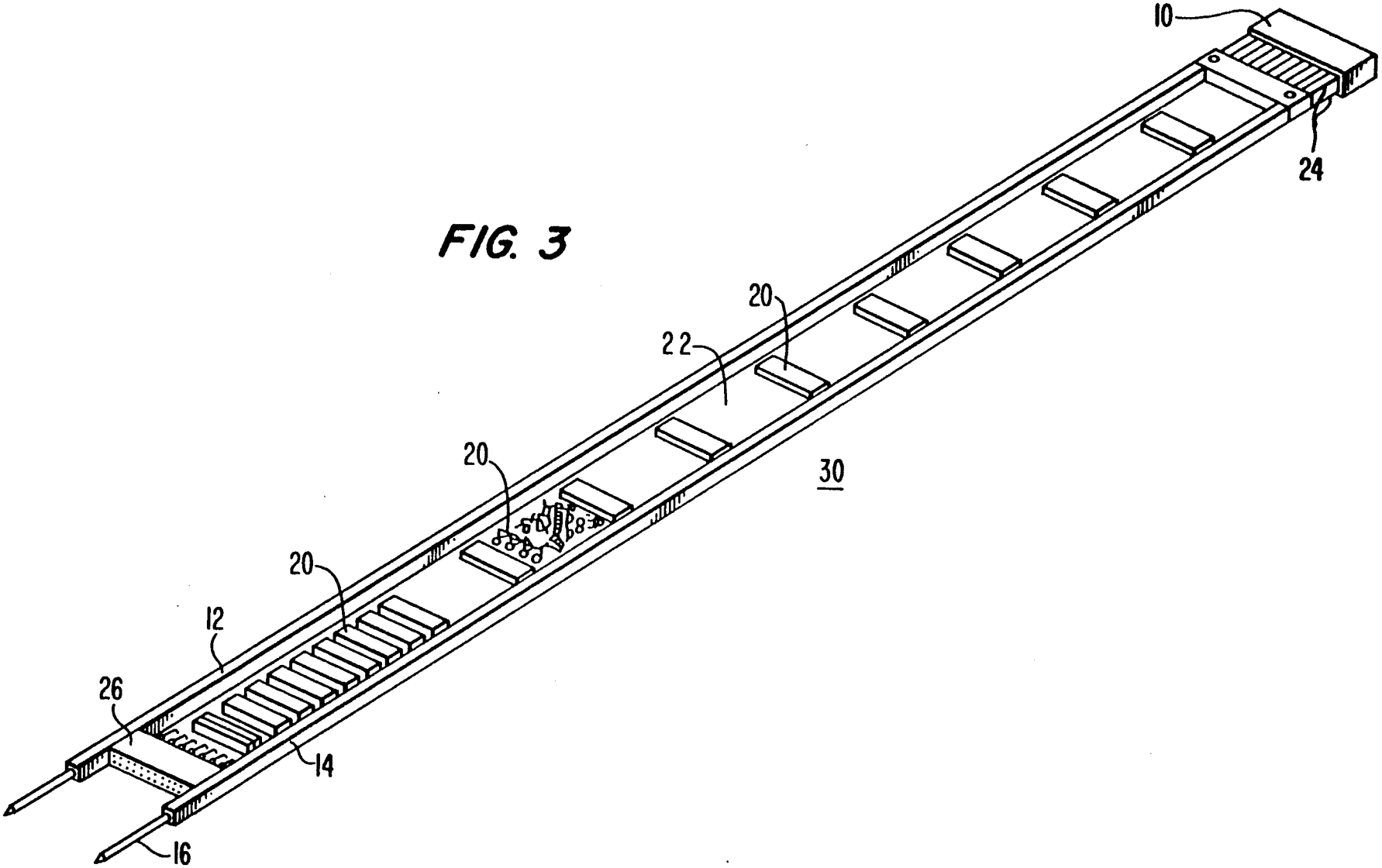
FIG. 3 is a perspective view of a contact module.

For the purposes of the following description, the embodiment of the assembly illustrated shall be assumed to be operable with an exemplary array 36 of contact members 32 of the testing apparatus designed for a total of 8,192 contacts 32. Actual embodiments which are constructed may have 256×256 contact positions (65,536 contacts in total), or more or fewer contact positions as a matter of design choice. The disclosed embodiment has only 8,192 contact positions merely for the sake of clarity of this description.

In this disclosed embodiment, it is assumed that the array 36 comprises 128 contact positions in the longitudinal or Y direction and 64 contact positions in the transverse or X direction. The contact array 36 is arranged in a grid-like manner to define equally sized segments 38 which are placed side by side, which may be rectangular in plan view and each of which may comprise, for example, 64 individual contact [position] *positions* which may be arranged sixteen in the longitudinal or Y direction and four in the transverse or X direction. As a result there *are* 128 segments, and a base plate 18 has thereon a total of 128 contact plug positions, eight positions in the longitudinal direction and sixteen positions in the transverse direction. A plurality of contact modules 30 are identical in construction and may be plugged into any of the 128 positions mentioned above.

As shown in the perspective view of FIG. 3, each contact module 30 has a top contact plug-type connector 10 which is supported at or adjacent to a contact plane of array 36 by two elongated, vertically downwardly extending supporting rods 12, 14, preferably made of a material such as aluminum. These rods are preferably square in cross section and are preferably reduced at their lower ends to form circular cross-section, stub portions 16, adapted to engage complementary openings in base plate 18, which itself is preferably fabricated of a metal such as aluminum. To ensure reliable contact n the testing of printed circuit boards, considerable contact pressure must be exerted, such as 0.66 pounds per contact member. The exemplary total of 8,192 contact [member] *members* 32 will result in a total pressure of about 2.5 tons, which all of the contact [connectors 10] modules have to accept.

This maximum pressure to be accepted by the contact plugs is transmitted to base plate 18 by the aforesaid elongated supporting rods 12, 14, with the base plate in turn supported in a suitable manner on the frame of the printed circuit board testing apparatus (not shown). The space remaining vertically below the outlines or contours of each contact connector 10 (which may be rectangular when viewed in the contact plane) is used to accommodate to major portion of the associated electronic components 20 for the printed circuit board testing apparatus. This is preferably done by means of a multi-layer circuit board 22 which at its top end is connected to [pins 32 (to be discussed below) of] the contacts 32a of upper connector 10 through suitable conductors or wires 24 and is secured to the elongated supporting rods 12, 14. In horizontal section the dimensions of a module 30 are limited to that of the end surface of respective contact connector 10 adjacent the contact plane. However, the space below contact connector 10 is not so limited for the reception of electronic circuit components because it may be lengthened as needed in a direction perpendicular to the contact plane 36. Circuit board 22, which is to receive electronic components 20, may be made as long as is necessary to accommodate whatever electronic circuitry is needed. By using large-scale integrated (LSI) circuit components, the packing density of the electronic components may be very high so that space requirements still result in sizes of [module] *modules* 30 that are easily handled in practical applications.

In the exemplary embodiment illustrated, a twenty-two pole contact lower connector 26 is used at the bottom end of the circuit board 22, said connector 26 having poles connected to the printed conductors at the bottom end of the multi-layer circuit board 22 by means such as soldering. Contact connector 26 is provided to make contact with vertical upright contact pins 28 on a base array plate 44 which is placed on base plate 18 and includes openings through which pass the bottom end portions of supporting rods 12, 14. Base array plate (the module control plate) 44 has thereon suitable printed circuitry to address (by known two-dimensional addressing processes or by using known two-dimensional addressing logic) the various contact modules 30 positioned at user selected positions on the base plate 44 and to thus control these contact array modules 30.

The top contact connector 10 serves (to receive (in the exemplary embodiment herein described) 64 tulip- or mushroom-shaped replaceable contact pins 32b of a hard and wear-resistant material such as steel. The lower ends of the shank portions of these contact pins 32b are seated in the contacts 32a of connector 10 in a manner such that electrical contact will be made to one of the 64 poles. The top portions of [pines 32] *pins 32b* are received by a plate 34 having therein a regular grid of perforations, plate 34 being dimensioned to overlie a plurality (such as four) of contact connectors 10 (contact array segments). The contact pins 32b have enlarged upper ends supported by the perforated plates and forming individual contacts 32' in *a plane parallel to* the contact plane of array 36. As the individual contacts 32' are designed as parts of readily replaceable wear-resistant contact pins 32b, the contact assembly in its entirety allows for easy servicing and maintenance.

As follows from the above descriptions, the unit 30 comprising the top and bottom contact connectors 10 and 26 and the two supporting rods 12, 14 having circuit board 22 and the electronic components 20 mounted thereon is referred to as a contact module or driver plate. In [a plane extending parallel with] the contact plane [26] *of array 36,* the outline of each contact module or driver plate 30 is limited by the outline of top contact connector 10 adjacent the contact plane. The height dimension of each module or unit in the vertical direction, however, may be chosen freely by the designer according to requirements. Each one of the contact modules 30 may be placed at any of the plug-in positions (128 such positions are in the illustrated exemplary embodiment) on base array plate 44 or a base grid plate or controller circuit board 42, respectively, and due to its mechanical construction, the module is suited to transmit to base plate 18 the contact pressure acting on its end surface through its own supporting rods without placing a high mechanical load on bottom contact connector 26 or on controller circuit board 42. Insulation layer 40 is positioned between base plate 10 and controller circuit board 42.

The subdivision of the contact plane and the accommodation of a major portion of the electronics associated with each contact array segment 38 in the space directly below it in the plug-in driver plates/contact modules 30 constructed to transmit high loads offer to the buyer of printed circuit board testing apparatus the possibility of buying only the number of modules 30 needed for the testing tasks he faces. The positions 38 not occupied by active driver plates/contact array modules 30 on the base array plate 44 are preferably filled with dummy modules or plates, i.e., inactive contact array modules or driver plates which have the same outer shape and mechanical characteristics as the active modules or plates, but carry no expensive electronics, in order to transmit the high mechanical loads from contacts 32.

The aforementioned savings are increased by the fact that a given number of active driver plates or modules 30 may be used to test circuit boards having a variety of shapes as the active driver plates or modules and the dummy modules may, by a small number of simple manual operations, be moved to other positions so as to accommodate new and differently shaped circuit boards. Thus, any driver plates or modules that are useless in a specific area can be readily moved to positions where they are needed. As a result, the invention creates the possibility of providing a printed circuit board testing apparatus which is basically designed to accommodate very large contact arrays but obviates the necessity of purchasing all of the expensive electronics required for a maximum size of circuit boards that may never have to be tested.

At the same time, the electronics on the contact modules available can be used to optimum efficiency because the modules may be moved at will (within the limits of the boundaries) for adaptation to a variety of shapes of printed circuit boards.

Having described the invention in connection with specific embodiments thereof, modifications which would be apparent to those skilled in the art can be made without departing from the spirit and scope of the invention. Accordingly, it is not intended that the invention be limited to the disclosed embodiment except as required by the appended claims.

What is claimed is:

1. In an assembly for use with a computer-controlled printed circuit board testing apparatus for determining whether the electrical connections of printed circuit boards to be tested correspond to computer-memorized connections of a master printed circuit board, the testing apparatus being of the type including controlling computer logic, *and* a plurality of contact members supported by the apparatus to be pressed by a printed circuit board to be tested such that electrical connections of the printed circuit board to be tested contact the contact members *via a mount provided to receive the printed circuit board,* the contact members being arranged within a grid-like array of equally sized segments, *said assembly including* means for electrically connecting the contact members to the controlling computer logic, and means for absorbing the pressure of the printed circuit board to be tested being pressed against the contact members *via the mount,* the improvement [wherein said assembly comprises] *comprising:* a base plate to be supported in spaced relationship below the contact members of the testing apparatus;

said connecting means including a plurality of modules of identical construction extending upwardly from said base plate;

each said module including an upper connector having an outer contour defining a respective segment and defining therebelow a space limited by said outer contour, said upper connector having an arrangement of contacts to be connected to the contact [elements] *members* of the testing apparatus upon a printed circuit board to be tested being pressed thereon *via the mount,* and upper surfaces of said upper connectors defining a contact plane;

each said module including electronic components confined within the respective said space and connected to said contacts of the respective said upper connector; and each said module including a lower connector means, located within the respective said space and connected to the respective said electronic components, for electrically connecting said respective electronic components to the controlling computer logic of the testing apparatus;

wherein said pressure absorbing means comprises, for each said module, at least one supporting rod *directly* connected to *and supporting* the respective said upper connector and extending downwardly through the respective said space and releasably supported by said base plate;

whereby said modules may be selectively relocated on said base plate and selected said modules may be removed from said assembly or additional modules may be added thereto, such that said assembly may be employed to test printed circuit boards of various different sizes and shapes.

2. The improvement claimed in claim 1, wherein each said module further includes a multi-layer circuit board within the respective said space and secured to the respective said supporting rod, and the respective [said] electronic components *of the testing apparatus* are disposed on said circuit board.

3. The improvement claimed in claim 1, wherein said supporting rod has a reduced size lower end fitting into a complementary shaped opening in said base plate.

4. The improvement claimed in claim 1, wherein each said module includes two said supporting rods extending from the respective said upper connector.

5. The improvement claimed in claim 1, wherein said base plate has therein a grid of openings receiving reduced size end portions of said supporting rods.

6. The improvement claimed in claim 1, wherein each said upper connector comprises a plug-in connector having an outer configuration defining said contour.

7. The improvement claimed in claim 6, further comprising a plurality of contact pins [acted on by the] *comprising* contact members of the testing apparatus and extending into said plug-in connectors to contact said contacts thereof.

8. The improvement claimed in claim 7, further comprising a perforated grid plate through which extend said contact pins for a plurality of said connectors.

9. The improvement claimed in claim 1, wherein each said lower connector means comprises a plug-in connector located above said base plate a sufficient distance to remain unloaded by contact pressure acting on the respective said upper connector.

10. The improvement claimed in claim 1, wherein said base plate has thereon means defining a plurality of contact positions aligned with respective said spaces.

11. The improvement claimed in claim 10, further comprising a control circuit board forming part of the controlling computer logic of the testing apparatus and supported on said base plate, said control circuit board including said contact position defining means.

12. The improvement claimed in claim 11, wherein said contact position defining means comprises upright contact pins extending upwardly from said control circuit board at positions to be connected to respective said lower connector means.

13. The improvement claimed in claim 12, further comprising an insulating plate positioned between said base plate and said control circuit board.

14. [A] *In a* contact module for use with a computer-controlled printed circuit board testing apparatus for determining whether [the positions of] the electrical connections of printed circuit boards to be tested correspond to computer-memorized [information] *connections* of a master printed circuit board, the testing apparatus being of the type including controlling computer logic, a base plate, a plurality of contact members supported by the apparatus to be pressed by a printed circuit board to be tested such that electrical connections of the printed circuit board to be tested contact the contact members *via a mount to receive the printed circuit board,* the contact member being arranged within a grid-like array of equally sized segments, means for electrically connecting the contact members to the controlling computer logic, and means for absorbing the pressure of the printed circuit board to be tested being pressed against the contact members *via the mount, the improvement wherein* said contact module [including] *includes* the connecting means and the pressure absorbing means of the testing apparatus and comprising:

an upper connector having an outer contour defining a respective segment and defining therebelow a space limited by said outer contour, said upper connector having an arrangement of contacts to be connected to the contact [elements] *members* of the testing apparatus upon a printed circuit board to be tested being pressed thereon *via the mount,* and said upper connector having an upper surface extending in a contact plane to be defined by upper surfaces of [uppers] *upper* connectors of an assembly formed by a plurality of [said] *similar* modules;

at least one supporting rod *directly* connected *to and supporting* said upper connector and extending downwardly therefrom through said space, said supporting rod having at a lower end thereof means for releasable connection to the base plate of the testing apparatus;

electronic components confined within said space and connected to said contacts of said upper connector; and lower connector means, located within said space and connected to said electronic components, for electrically connecting said electronic components to the controlling computer logic of the testing apparatus.

15. A module as claimed in claim 14, further comprising a multi-layer circuit board within said space and secured to said supporting rod [said] *and* electronic components *of the testing apparatus* being disposed on said circuit board.

16. A module as claimed in claim 14, wherein said upper connector comprises a plug-in connector having an outer configuration defining said contour.

17. A module as claimed in claim 16, further comprising a plurality of contact pins [to be acted on by the] *comprising* contact members of the testing apparatus and extending into said plug-in connector to contact said contacts thereof.

18. A module as claimed in claim 14, wherein said lower end of said supporting rod is of reduced size to be fitted into a complementary shaped opening in the base plate of the testing apparatus.

19. A module as claimed in claim 14, comprising two said supporting rods extending from said upper connector.

20. A module as claimed in claim 14, wherein said lower connector means comprises a plug-in connector.

* * * * *